Dec. 14, 1965 D. L. FAYMAN 3,223,928

APPARATUS FOR ACCURATELY MULTIPLYING THE FREQUENCY OF AN ELECTRICAL SIGNAL OF ANY FREQUENCY WITHIN A GIVEN RANGE OF FREQUENCIES

Filed March 28, 1963

INVENTOR.
David L. Fayman
BY
Hovey, Schmidt, Johnson & Hovey
ATTORNEYS.

United States Patent Office 3,223,928

Patented Dec. 14, 1965

3,223,928

APPARATUS FOR ACCURATELY MULTIPLYING THE FREQUENCY OF AN ELECTRICAL SIGNAL OF ANY FREQUENCY WITHIN A GIVEN RANGE OF FREQUENCIES

David L. Fayman, Merriam, Kans., assignor to Oread Electronics Laboratory, Inc., Lawrence, Kans., a corporation of Kansas Filed Mar. 28, 1963, Ser. No. 268,675
7 Claims. (Cl. 328—23)

This invention relates generally to apparatus for multiplying the frequency of an electrical signal. More specifically, the invention teaches means which may be employed over a wide frequency spectrum to multiply the frequency of any signal within the spectrum for use in applications requiring a wide band frequency multiplier.

The frequency multipliers or harmonic generators widely used in electronic applications are limited to relatively narrow band widths unless the multipliers are provided with variable tuning circuits. The limiting factor is the value of Q of the output tank circuits of these harmonic generators as a relatively high Q must be maintained in order to obtain efficient operation. Tunable tank circuits, of course, greatly extend the frequency range of a multiplier, but frequent adjustment of the tuning controls is necessary if a wide frequency spectrum is to be covered.

The problem of providing a fixed tuned frequency multiplier becomes especially acute at the lower frequencies. For example, if a respectable Q of 50 is to be used, the band width of the multiplier will be 2% of the center frequency. At a frequency of 500 kc. this band width is 10 kc. wide. However, at a frequency of 5,000 c.p.s. the band width is only 100 c.p.s. It may be seen, therefore, that for electrical signals of a very low frequency, even a frequency multiplier having a variable tank circuit is unsatisfactory where large and rapid frequency variations may be encountered.

An even more vivid example of the instant problem occurs when it is desired to determine the frequency of a signal by a digital frequency counter. At the higher frequencies, these digital counters are capable of high accuracy according to the following formula:

$$\text{Accuracy} = \pm 1 \text{ count} \pm \text{time base stability}$$

Acceptable time base stability error for most applications is on the order of 0.01% to 0.001%. It may be seen from the formula, therefore, that at the higher frequencies the time base stability is the main error factor.

At frequencies below 10,000 c.p.s. the count error becomes increasingly predominant. At 1,000 c.p.s. for example, the possible count error is 0.1% or ten to one hundred times as great as the acceptable time base stability error. This count error may be remedied, of course, by multiplying the frequency of the signal until the count error becomes negligible. However, when such frequency multiplication is undertaken with respect to a signal whose frequency may be anywhere within a given frequency range, the problems discussed in the preceding paragraphs are applicable.

It is, therefore, an object of this invention to provide apparatus for multiplying the frequency of an electrical signal of any frequency within a given wide range of frequencies.

It is another object of this invention to provide apparatus for accurately multiplying the frequency of such an electrical signal by a predetermined integer value.

It is yet another object of this invention to provide apparatus capable of said multiplication by a predetermined integer value over a wide spectrum of frequencies to be multiplied.

Other objects will become apparent as the detailed description proceeds.

Figure 1:
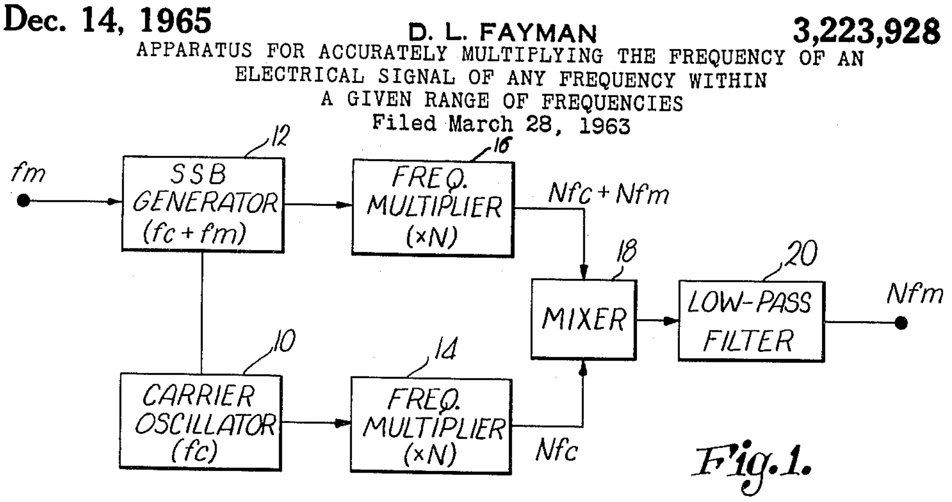
FIGURE 1 illustrates the concepts of the present invention in block diagram form.

Referring to FIG. 1, a currently preferred embodiment of apparatus suitable to effect the teachings of the present invention is shown. A carrier oscillator 10 comprising circuitry of any conventional design generates a carrier signal $fc$. A single side band suppressed carrier generator 12 receives the carrier signal $fc$ and also receives the electrical signal to be multiplied $fm$. The output of the single side band generator is a signal of a frequency equal to $fc+fm$ (or $fc-fm$, if desired). It should be understood that either the upper side band ($fc+fm$) or the lower side band ($fc-fm$) may be utilized in the present invention, but for purposes of illustration, the upper side band $fc+fm$ will be used in the description to follow. It is only of primary importance that the frequencies $fc$ and $fm$ be combined to obtain a combination frequency equal to either $fc+fm$ or $fc-fm$.

The output of the carrier oscillator 10 is coupled with a frequency multiplier 14. The output of the SSB generator 12 is coupled with frequency multiplier 16. Both of these frequency multipliers 14 and 16 may be any conventional vacuum tube or transistor harmonic amplifiers tuned to the desired harmonic. This harmonic will be designated "N" in the description to follow. This may represent any integer value. Since frequency multipliers are conventional and widely used in the various electronic arts, this specification need not set forth a complete detailed description thereof. For further information with regard to these multipliers, reference is made to F. E. Terman, "Harmonic Generators," Electronic and Radio Engineering, pp. 473–476.

As shown in FIG. 1, the output from frequency multiplier 16 is a signal having a frequency equal to $Nfc-Nfm$. The output from frequency multiplier 14 is a signal of frequency $Nfc$. These two multiplied signals are fed to a mixer or product detector 18. The output from mixer 18 contains several signals of different frequencies including a signal of frequency $Nfm$. The output from mixer 18 is then coupled with a low-pass filter 20 where all of the signals from the mixer output are substantially attenuated except the $Nfm$ signal.

The mixer 18 is a conventional electronic device employing the heterodyne principle to beat the $Nfc+Nfm$ signal with the $Nfc$ signal to obtain the desired $Nfm$ signal plus others which are eliminated by filter 20. Since mixers of this general type are widely used in superheterodyne radio receivers and other common electronic equipment, the circuitry of the mixer need not be herein described in detail. For further information with regard to mixer operation and suitable circuitry, reference is made to A. V. Eastman, "Fundamentals of Vacuum Tubes," Chap. XII, "Modulators and Demodulators," pp. 445–543, and Truman S. Gray, "Applied Electronics," Principles of Electrical Engineering Series, The Technology Press of M.I.T., 2nd Edition, 1956, pp. 757–761.

The low-pass filter 20 may be a low-pass network of any of the conventional types well known to those skilled in the art. The output of mixer 18 may contain the following frequencies: $Nfc$, $Nfc-Nfm$, $2Nfc-Nfc$, $Nfm$, and harmonics thereof. Therefore, since the frequencies of all the signals from the mixer output are well above the frequency of the $Nfm$ signal, the pass-band of filter 20 may be conveniently set to pass only the $Nfm$ signal.

The reason for the sequence of operations as performed by the apparatus of FIG. 1 becomes apparent when the particular frequencies chosen for $fm$ and $fc$ are considered. Since the invention is concerned with wide band frequency multiplication, it is requisite that the frequencies of the signals multiplied by multipliers 14 and 16 be sufficiently high so that the band width of the tuned output circuits of the multipliers will be of the desired width. For example, if the apparatus were desired for utilization in combination with digital frequency counters to multiply the frequency of an input signal lying in the frequency range of 1 to 10,000 c.p.s., a carrier frequency $fc$ of 500 kc. would be suitable. With a Q of 50 for the tank circuits of the frequency multiplier stages 14 and 16, the 500 kc. carrier frequency would allow a 10 kc. band width and thus would include the desired range of input signal frequencies. It should be understood that it is not intended that the application of this invention be limited to low frequency applications such as digital counting, the above example being only illustrative of one particular frequency combination of $fc$ and $fm$ which vividly shows the uniquely broad frequency range of the invention.

Figure 2:
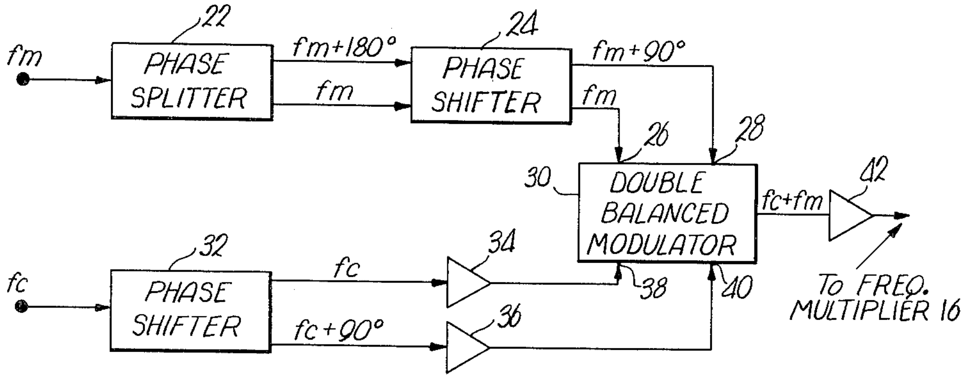
FIG. 2 is a block diagram of the single side band suppressed carrier generator shown in FIG. 1.

In FIG. 2, a suitable embodiment of the SSB generator 12 is shown in greater detail and illustrates one method of single side band suppressed carrier generation that may be utilized in the practice of the present invention. The signal of frequency $fm$ is fed to a phase splitting network 22 which provides an output ($fm$) in phase with the input signal and an output ($fm+180°$) which is 180° out of phase with the input. The $fm$ and $fm+180°$ signals are coupled with a 90° phase shift network 24 which provides an output $fm$ and an output $fm+90°$. The $fm$ and $fm+90°$ signals are coupled respectively with inputs 26 and 28 of a double balanced modulator 30. The carrier signal $fc$ is fed to a 90° phase shift network 32 which produces an output signal ($fc$) in phase with the carrier, and an output signal ($fc+90°$) which is 90° out of phase with the carrier. The $fc$ and $fc+90°$ outputs are, respectively, coupled with amplifiers 34 and 36 for amplification and equalization. Amplifiers 34 and 36 are untuned resistance-capacitance coupled amplifiers of any conventional design suitable for the frequencies to be handled. The outputs thereof are coupled respectively with inputs 38 and 40 of modulator 30. The output from modulator 30 is the upper side band signal $fc+fm$ which may be amplified by amplifier 42 before the signal is coupled with frequency multiplier 16. If the invention is applied using the lower side band, then the output of modulator 30 would, of couse, be $fc-fm$.

Figure 3:
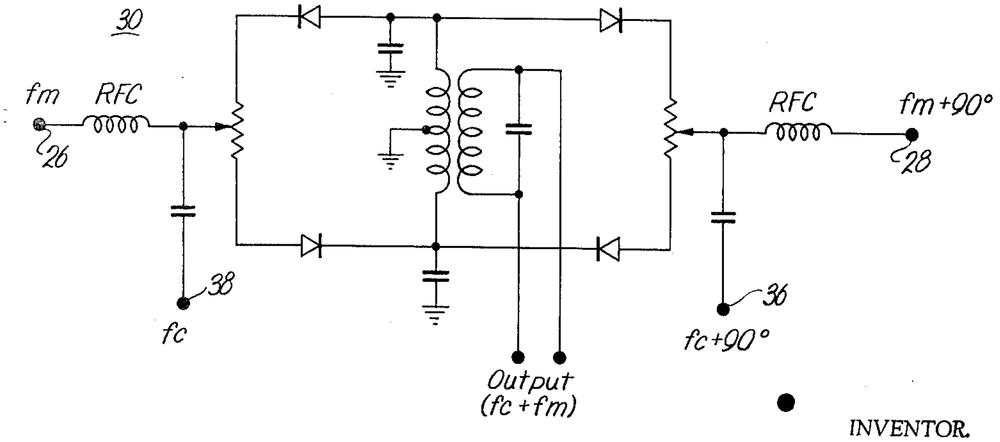
FIG. 3 is a schematic diagram of the double balanced modulator shown in FIG. 2.

The phase splitting network 22 and the phase shifters 24 and 32 may be of any conventional design. The double balanced moduator 30 is also conventional; however, an example of a suitable modulator is illustrated in FIG. 3. The inputs and output are referenced by like notation, so that the diagrams of FIGS. 2 and 3 may be conveniently interrelated. A detailed description of the circuitry shown in FIG. 3 may be found in D. E. Norgard, "The Phase Shift Method of Single Side Band Generation," Proceedings of IRE, December 1956, pp. 1725–1735.

It should be understood that the particular method of generating the single side band suppressed carrier signal is not critical. Any of the several known and conventional methods may be utilized. One alternate method, useful because of the simplicity of the circuitry, is the balanced modulator, side band filter method discussed in Gray, supra, pp. 750–753.

In the light of the foregoing description of apparatus suitable for practicing the invention, the operation of the invention may now be readily understood. The operation of the apparatus in multiplying the frequency of an electrical signal as contemplated by the invention involves the following steps.

First, a carrier signal ($fc$) of frequency higher than the signal ($fm$) whose frequency is to be multiplied, is generated.

Secondly, the carrier signal of frequency $fc$ is modulated by the signal $fm$ to yield a combination of signals of frequencies including an upper side band $fc+fm$ and a lower side band $fc-fm$, either of which may be taken and utilized as an output, the other being suppressed.

Thirdly, the frequencies of the carrier signal $fc$ and of the selected side band signal $fc+fm$ (or $fc-fm$) are each multiplied in frequency by the same integer value N.

Fourthly, the multiplied carrier signal $Nfc$ and the multiplied side band signal $N(fc+fm)$—or $N(fc-fm)$—are mixed or heterodyned to yield an output signal $Nfm$ of frequency corresponding to the frequency of the original signal $fm$ multiplied by the integer value N. The output $Nfm$ is, of course, the desired end result of the frequency multiplying operation contemplated by the invention, it being observed that the operation is independent of the value of the frequency of the initial signal $fm$ to be multiplied.

Having thus described the invention, what is claimed as new and desired to be secured by Letters Patent is:

1. Wide band frequency multiplying apparatus for multiplying the frequency of a first electrical signal by a predetermined integer value to obtain a signal of multiplied frequency comprising:

means for generating a second electrical signal of frequency higher than the frequency of said first signal;

means responsive to said first and second signals, coupled with said generating means and having means for coupling said first signal thereto, for combining the frequencies of said first and second signals to produce a third electrical signal of a frequency equal to the combination of said frequencies;

first frequency multiplying means coupled with said combining means for multiplying the frequency of said third signal by said predetermined integer value;

second frequency multiplying means coupled with said generating means for multiplying the frequency of said second signal by said predetermined integer value; and means coupled with said first and second multiplying means for subtracting the frequency of the lower of said multiplied second and third signals from the frequency of the higher thereof to produce said signal of multiplied frequency.

2. Apparatus as set forth in claim 1, wherein said combining means comprises modulating means.

3. Apparatus as set forth in claim 2, wherein said modulating means comprises a single side band suppressed carrier generator.

4. Apparatus as set forth in claim 1, wherein said subtracting means comprises mixer means for heterodyning the signals from the outputs of the first and second multiplying means and filter means coupled with the output of said mixer means for attenuating signals other than said desired signal.

5. Apparatus as set forth in claim 1, wherein said first and second multiplying means comprise harmonic generators.

6. Wide band frequency multiplying apparatus for multiplying the frequency of a first electrical signal by a predetermined integer value to obtain a signal of multiplied frequency comprising:

an oscillator for generating a carrier signal of a frequency substantially higher than the frequency of said first signal;

a single side band suppressed carrier generator, coupled with said oscillator and having means for coupling said first signal thereto, for modulating said carrier signal with said first signal to produce a single side band signal;

first frequency multiplying means coupled with said oscillator for generating a second signal of frequency equal to the frequency of said carrier signal multiplied by said predetermined integer value;

second frequency multiplying means coupled with said side band generator for generating a third signal of frequency equal to the frequency of said single side band signal multiplied by said predetermined integer value;

mixer means coupled with said first and second frequency multipliers for heterodyning said second and third signals to produce a plurality of signals including said signal of multiplied frequency; and filter means coupled with the output of said mixer means for attenuating signals other than the signal of multiplied frequency.

7. Apparatus as set forth in claim 6, wherein said side band generator comprises a first network coupled with the output of said oscillator for providing an output signal in phase with said carrier signal and an output signal 90° out of phase therewith, a second network adapted to have said first signal coupled thereto for providing an output signal in phase with said first signal and an output 90° out of phase with said first signal, and a double balanced modulator operably coupled with the outputs of said first and second networks for generating a number of signals including a pair of side band signals, the first of said pair of side band signals having a frequency equal to the sum of the frequencies of said first signal and said carrier signal, the second of said pair of signals having a frequency equal to the difference thereof, said modulator including output circuit means responsive to only one signal of said pair of signals for providing a single side band signal.

References Cited by the Examiner

UNITED STATES PATENTS

| | | | |
|---|---|---|---|
| 2,358,454 | 9/1944 | Goldstine | 325—153 |
| 2,423,103 | 7/1947 | Koechlin | 331—38 X |
| 2,946,963 | 7/1960 | Lee | 331—38 |

ARTHUR GAUSS, *Primary Examiner.*